(12) United States Patent
Armitage et al.

(10) Patent No.: US 8,390,023 B2
(45) Date of Patent: Mar. 5, 2013

(54) SAPPHIRE SUBSTRATE, NITRIDE SEMICONDUCTOR LUMINESCENT ELEMENT USING THE SAPPHIRE SUBSTRATE, AND METHOD FOR MANUFACTURING THE NITRIDE SEMICONDUCTOR LUMINESCENT ELEMENT

(75) Inventors: Robert David Armitage, Katano (JP); Yukihiro Kondo, Hirakata (JP); Hideki Hirayama, Asaka (JP)

(73) Assignees: Panasonic Corporation, Osaka (JP); Riken, Saitama (JP)

( * ) Notice: Subject to any disclaimer, the term of this patent is extended or adjusted under 35 U.S.C. 154(b) by 396 days.

(21) Appl. No.: 12/446,081
(22) PCT Filed: Oct. 19, 2007
(86) PCT No.: PCT/JP2007/070449
§ 371 (c)(1),
(2), (4) Date: Apr. 17, 2009
(87) PCT Pub. No.: WO2008/047907
PCT Pub. Date: Apr. 24, 2008

(65) Prior Publication Data
US 2010/0207136 A1 Aug. 19, 2010

(30) Foreign Application Priority Data
Oct. 20, 2006 (JP) ................................. 2006-286096

(51) Int. Cl.
*H01L 33/00* (2010.01)
(52) U.S. Cl. .................. 257/103; 257/79; 257/E33.003; 257/E21.121
(58) Field of Classification Search .................. 257/94, 257/352, E33.003, E21.121, 79, 103
See application file for complete search history.

(56) References Cited

U.S. PATENT DOCUMENTS
6,083,812 A * 7/2000 Summerfelt .................. 438/481
6,852,161 B2 * 2/2005 Urashima et al. ............. 117/104
(Continued)

FOREIGN PATENT DOCUMENTS
CN 1618116 5/2005
(Continued)

OTHER PUBLICATIONS
Matsuoka et al.; "GaN Growth on Novel Lattice-Matching Substrate: Tilted M-Plane Sapphire," Physica Status Solidi (A). Applied Research, vol. 188, No. 2, Nov. 23, 2001, pp. 485-489.
(Continued)

*Primary Examiner* — Robert Huber
(74) *Attorney, Agent, or Firm* — Greenblum & Bernstein, P.L.C.

(57) ABSTRACT

The present invention provides an inexpensive substrate which can realize m-plane growth of a crystal by vapor phase growth. In a sapphire substrate, an off-angle plane slanted from an m-plane by a predetermined very small angle is prepared as a growth surface, which is a template of the crystal, at the time of growing a crystal of GaN or the like, by a polishing process to prepare a stepwise substrate comprising steps and terraces. According to the above-described configuration, even if an inexpensive sapphire substrate, which normally does not form an m-plane (nonpolar plane) GaN film, is used as a substrate for crystal growth, the following advantages can be attained. Specifically, c-axis growth can be carried out from the plane of each step as an a-plane on the terrace by vapor phase growth, which is advantageous in the fabrication of a device, in order to grow an excellent GaN single crystal which has been epitaxially grown so that the m-plane is opposite to the surplane of the terrace, and, in the mean time, the steps become integrated (fused), whereby a device can be fabricated from a substrate of a GaN single crystal having no significant threading dislocation. Further, the use of the m-plane can advantageously eliminate the influence of piezo electric fields.

2 Claims, 5 Drawing Sheets

U.S. PATENT DOCUMENTS

| | | |
|---|---|---|
| 7,435,608 B2 | 10/2008 | Shibata |
| 2002/0033521 A1 | 3/2002 | Matsuoka |
| 2002/0155712 A1 | 10/2002 | Urashima et al. |
| 2008/0056984 A1 | 3/2008 | Yoshioka et al. |

FOREIGN PATENT DOCUMENTS

| | | |
|---|---|---|
| EP | 1182697 A2 | 2/2002 |
| JP | 2000-216497 | 8/2000 |
| JP | 2002-145700 | 5/2002 |
| JP | 2004-200578 | 7/2004 |
| JP | 2004-288934 | 10/2004 |
| JP | 2005-343713 | 12/2005 |
| JP | 2006-124268 | 5/2006 |
| KR | 2008-98076 | 11/2008 |

OTHER PUBLICATIONS

Search Report dated Jul. 20, 2011 in counterpart European Application No. 07 83 0183.

Office action dated Jan. 17, 2011 in counterpart Korean Application No. 10-2009-7010064, along with a partial english translation thereof, only English translation of Office Action Abstract considered.

"Characterization of Planar Semipolar Gallium Nitride Films on Sapphire Substrates" Japanese Journal of Applied Physics, vol. 45, No. 6, 2006, pp. L154-L156.

* cited by examiner

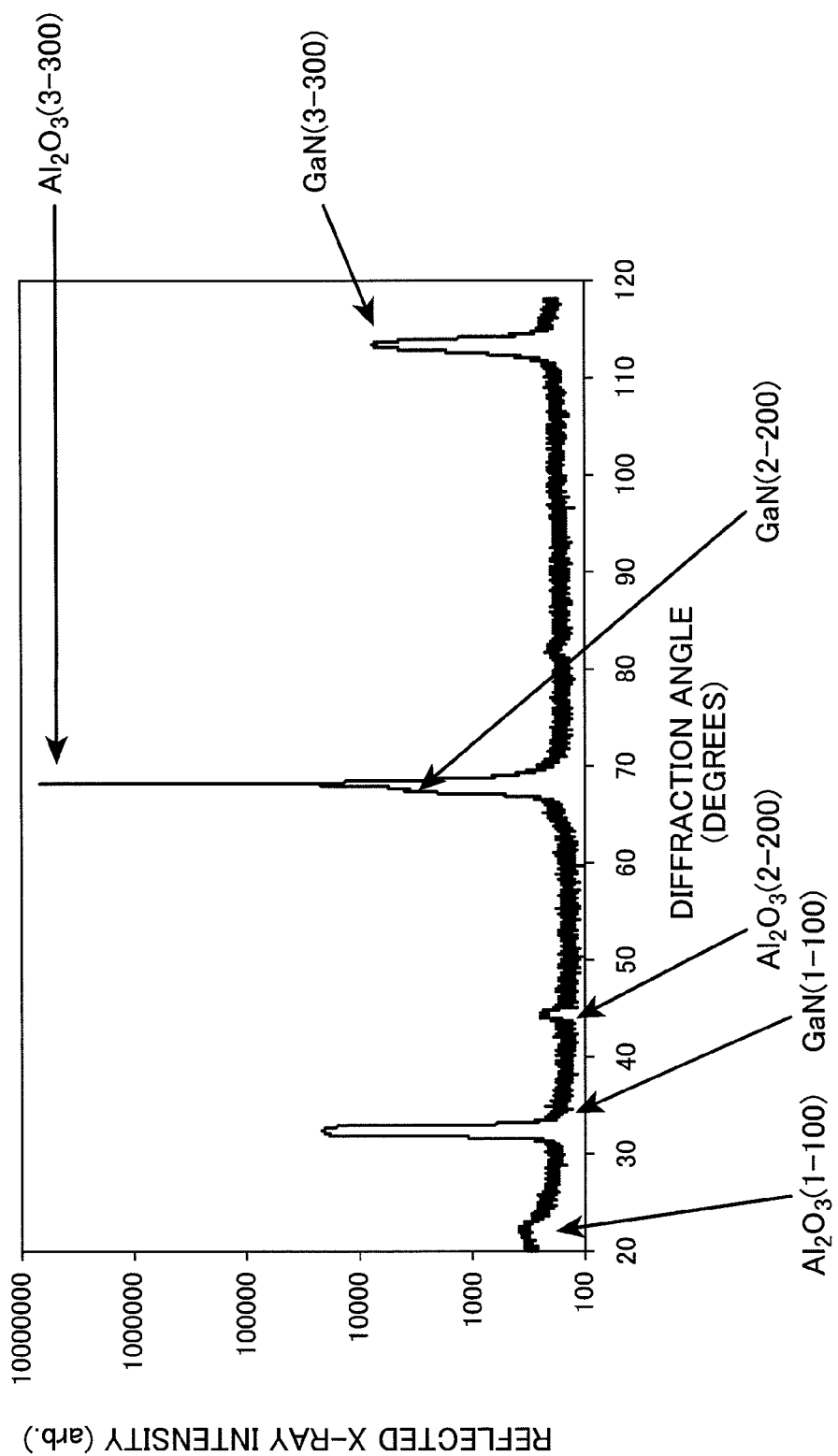

SAPPHIRE SUBSTRATE, NITRIDE SEMICONDUCTOR LUMINESCENT ELEMENT USING THE SAPPHIRE SUBSTRATE, AND METHOD FOR MANUFACTURING THE NITRIDE SEMICONDUCTOR LUMINESCENT ELEMENT

TECHNICAL FIELD

The present invention relates to a sapphire substrate, a nitride semiconductor luminescent element using the sapphire substrate, and a method for manufacturing the nitride semiconductor luminescent element.

BACKGROUND ART

In recent years, a nitride semiconductor luminescent element having an emission layer composed of a III-V group nitride semiconductor or the like has been a focus of attention. In one example, the structure of this luminescent element is composed in the manner that a sapphire substrate is used and there are formed, respectively, an emission layer made of InGaN or the like, a contact layer made of an n$^+$-GaN layer doped with silicon (Si) on the lower portion of the emission layer, an electron blocking layer made of p-Al$_x$Ga$_{1-x}$N doped with magnesium (Mg) on the upper portion of the emission layer, and a contact layer made of p-GaN on the upper portion of the electron blocking layer.

At present, such a GaN device as described above is formed on a substrate of c-plane growth. In order to further enhance the performance of an LED, an LD and the like, however m-plane growth is promising as an alternative to c-plane growth. In the case of an m-plane, an m-plane "p" layer having electrical conductance 20 times as high as that of a c-plane "p" layer has been reported. This "p" layer greatly contributes to the improvement of electrical characteristics, including the enhancement of current diffusion and the lowering of forward voltage. In addition, the m-plane has a crystal polarity perpendicular to a crystal growth surface and is, therefore, a nonpolar plane capable of negating high electric fields inherent in a crystal. Consequently, by performing crystal growth using the nonpolar m-plane, it is possible to increase an overlap of wave functions between electrons and holes and thereby obtain various advantages. Examples of these advantages include the realization of more enhanced internal quantum efficiency (whereby radiative recombination efficiency can be increased) and the realization of higher injection efficiency. Until now, however, an extremely expensive SiC or LiAlO$_2$ substrate, for example, has been necessary for the luminescence of GaN in the m-plane.

Hence, Japanese Patent Laid-Open No. 2006-124268 discloses performing the crystal growth of ZnO in the m-plane by using a solvothermal method and adjusting an angle formed between a seed crystal and the convection direction of a solvent.

In the above-described related art, a seed crystal, such as ZnO, is grown using a liquid phase method (solvothermal method). Accordingly, in order to fabricate a device, the substrate in process needs to temporarily taken out of a furnace and once again processed into a device using an MOCVD method or the like. Thus, the process of the related art is cumbersome and complicated, compared with a vapor phase method in which a process from the fabrication of a substrate to the fabrication of a device can be carried out continuously.

In addition, the Japanese Journal of Applied Physics, 45, L154 (2006) describes a method, in which an m-plane sapphire substrate is used, as a method for growing nonpolar GaN. In that method, however, m-plane GaN does not grow and only semipolar GaN is obtained.

DISCLOSURE OF THE INVENTION

An object of the present invention is to provide a sapphire substrate whereby a nitride semiconductor crystal can be m-plane grown using a vapor phase method, a nitride semiconductor luminescent element using the sapphire substrate, and a method for manufacturing the nitride semiconductor luminescent element.

A method for manufacturing a sapphire substrate, a nitride semiconductor luminescent element using the sapphire substrate, and a nitride semiconductor luminescent element in accordance with the present invention uses the sapphire substrate for crystal growth and include a cutting step of preparing a-plane slanted from the m-plane by a predetermined very small angle, prior to a crystal growth step, at the time of using the m-plane of the sapphire substrate as a growth surface. With the manufacturing method configured in this way, a c-plane of GaN is allowed to grow from each step plane formed as an a-plane onto a terrace in a vapor phase method, such as an MOCVD method, by controlling the steps of a substrate, even if an inexpensive sapphire substrate which normally does not form any m-plane (nonpolar plane) GaN film is used as the substrate for crystal growth. Thus, an epitaxially-grown excellent GaN single crystal continues to grow, so that the m-plane thereof is opposite to the surplane of the terrace. In the mean time, the respective steps become integrated (fused) with one another. Thus, it is possible to grow an m-plane GaN single crystal. In addition, the use of an m-plane eliminates the influence of piezo electric fields and makes it possible to increase the overlap of wave functions between electrons and holes. In this way, a substrate and a device which can enhance radiative recombination efficiency, i.e., internal quantum efficiency, can be realized.

BRIEF DESCRIPTION OF THE DRAWINGS

FIG. 5 is a graph showing the results of X-ray diffraction.

BEST MODE FOR CARRYING OUT THE INVENTION

Figure 1:
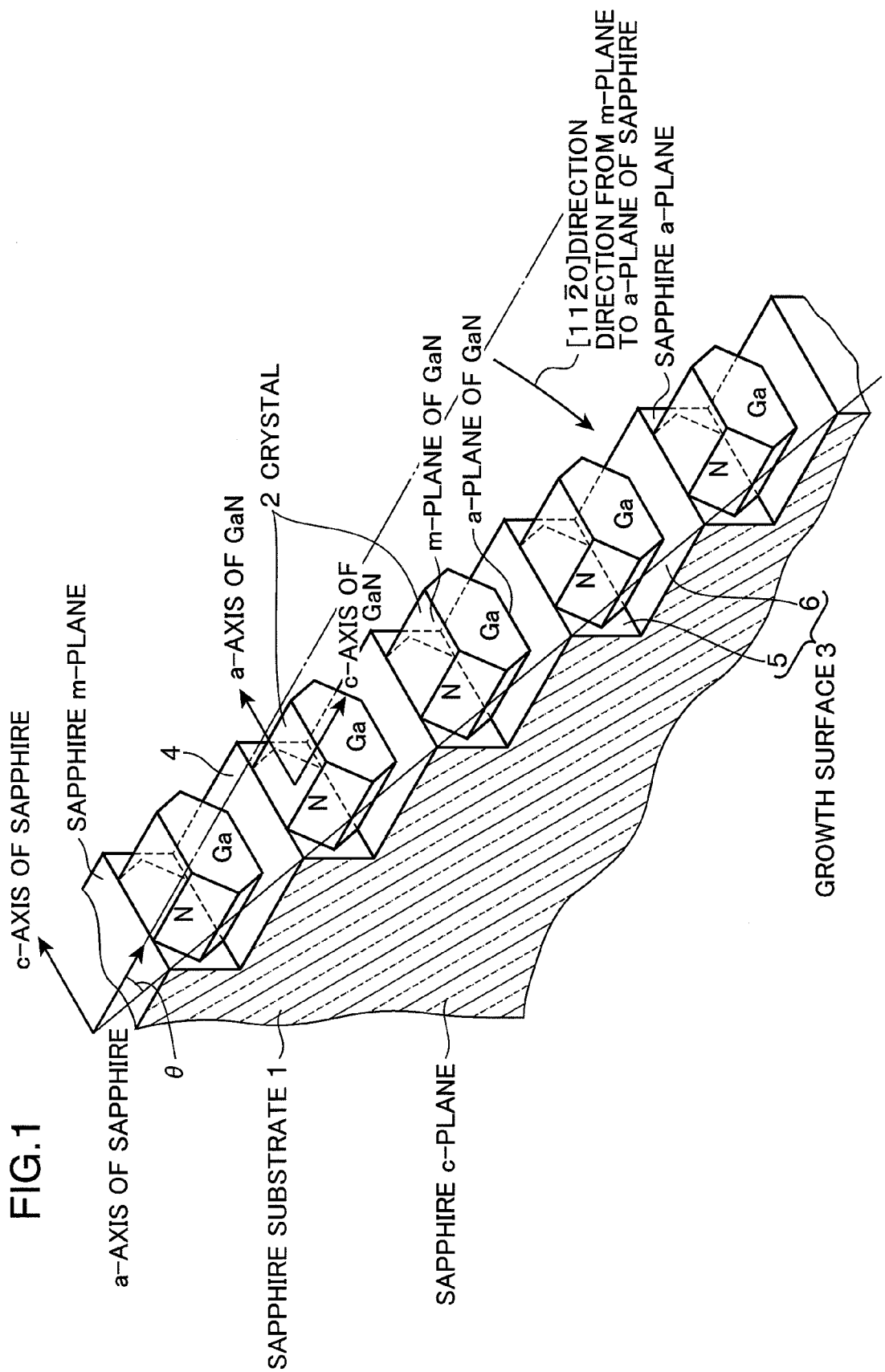
FIG. 1 is a perspective view illustrating the growth process of a nitride semiconductor luminescent element using a sapphire substrate in accordance with one embodiment of the present invention.

Hereinafter, one embodiment in accordance with the present invention will be described on the basis of the accompanying drawings. Note that in the respective drawings, constituent elements denoted by like reference numerals are the same as one another and will not be explained again.

Figure 2:
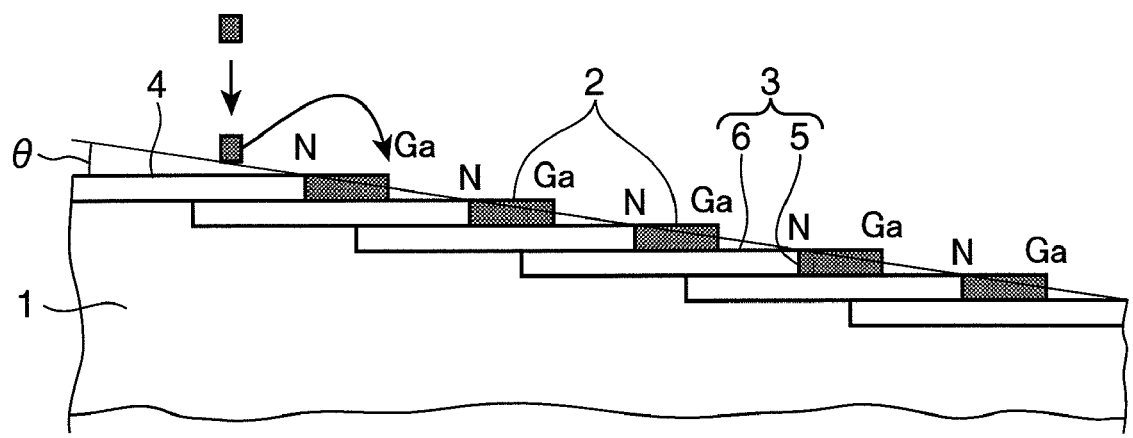
FIG. 2 is a vertical cross-sectional view of FIG. 1.

FIG. 1 is a perspective view illustrating the growth process of a nitride semiconductor luminescent element using a sapphire substrate 1 in accordance with one embodiment of the present invention, whereas FIG. 2 is a vertical cross-sectional view of FIG. 1. It should be noted that in the sapphire substrate 1 of the present embodiment, when a crystal 2 which is a nitride semiconductor of a III-V group or the like, such as GaN, is grown, there is first prepared by a cutting step, an off-angle plane, as a growth surface 3 to serve as a template of the crystal 2, slanted from an m-plane 4 by a predetermined very small angle θ, preferably 0.2 to 10 degrees, more preferably 0.5 to 4 degrees, and particularly preferably only 2 degrees or so, in a [11$\bar{2}$0] direction, i.e., in a direction from the m-plane toward an a-plane. That is, the present embodiment uses a sapphire substrate 1 in which an off-angle has been controlled.

Specifically, this is because an experiment carried out by the present inventor has shown that a-axis GaN growth occurs on the sapphire c-plane and c-axis GaN growth occurs on the sapphire a-plane. For this reason, the m-plane substrate is off-cut toward the [11$\bar{2}$0] direction. The sapphire substrate 1 forms a stair-like stepwise substrate having an a-plane step 5 and an m-plane terrace 6 on the growth surface. Thus, it is possible to grow c-axis oriented GaN from the a-plane step 5.

For example, assuming that θ=1 degree, then the length of the terrace 6 is approximately 12 nm and the height of the step 5 is approximately 1 nm. In the growth surface 3 thus created, each step 5 forms an a-plane of sapphire, as described above, and the a-plane of the crystal 2 grows from the plane of each step 5 onto the terrace 6 (GaN grows from the plane of the step 5 along the c-axis). Thus, an epitaxially-grown excellent crystal 2 continues to grow, so that the m-plane thereof is opposite (upper side in FIGS. 1 and 2) to the surplane of the terrace 6. The reason for the occurrence of such growth is assumed to be that when the crystal 2 changes from a nucleic shape to an island shape as it is grown, crystal growth in the same plane takes place in order to minimize crystal growth energy. This crystal 2 serves as a seed crystal and, in the mean time, the respective steps 5 become integrated (fused) with one another. Thus, it is possible to obtain a device by taking advantage of the m-plane growth of a nitride.

Figure 3:
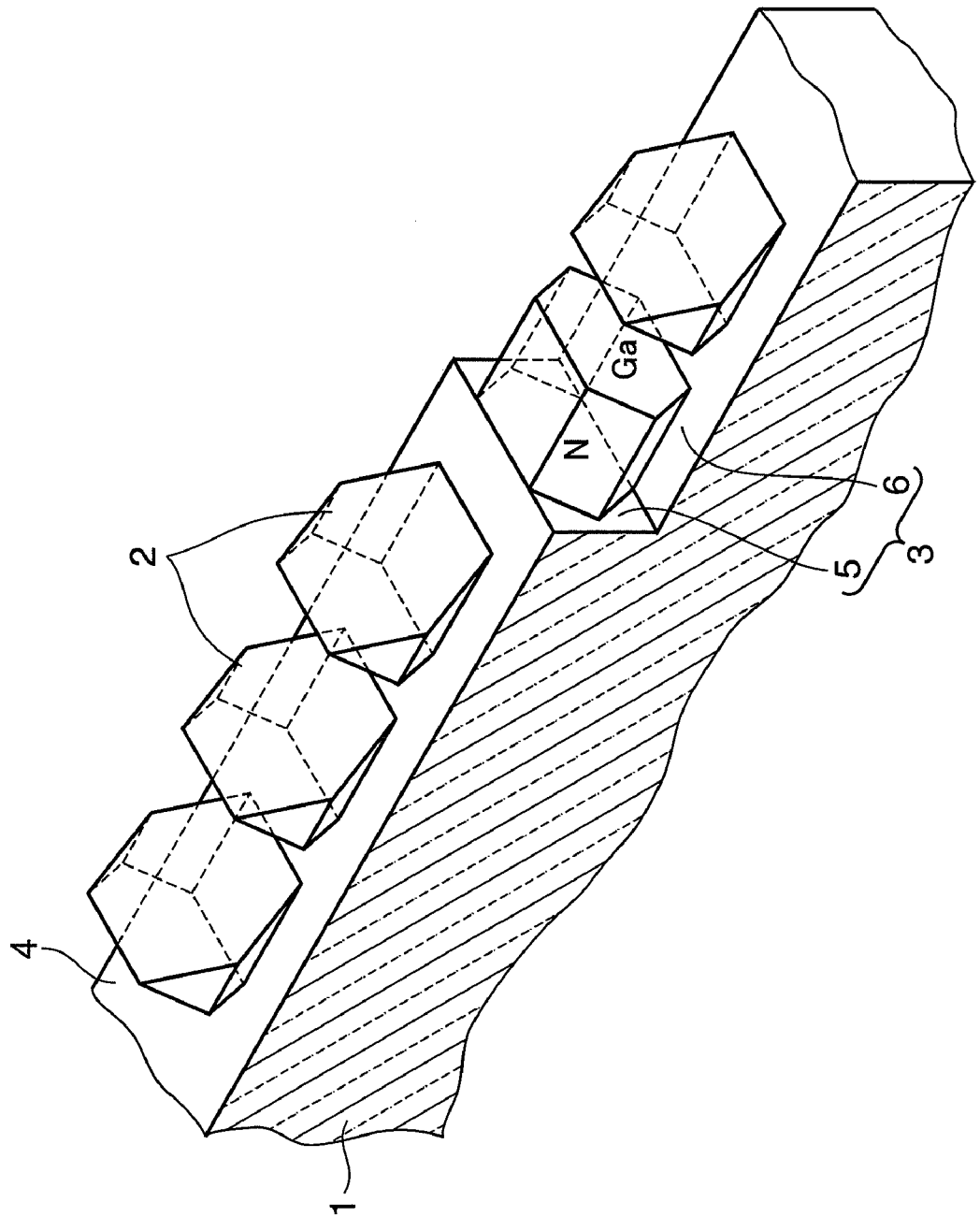
FIG. 3 is a perspective view illustrating a growth process under conditions other than those of the present invention.
Figure 4:
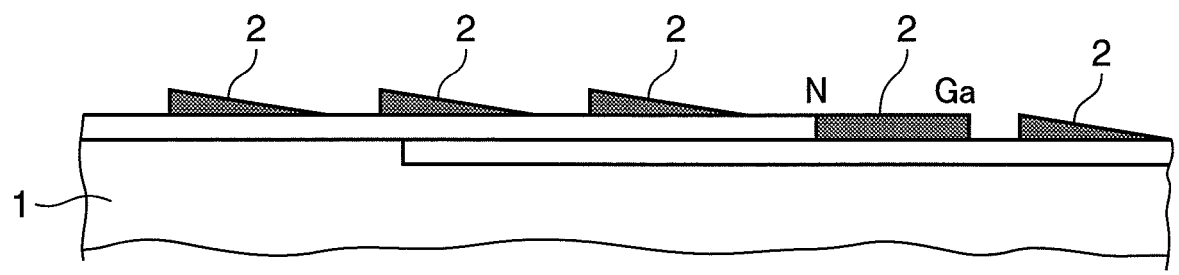
FIG. 4 is a vertical cross-sectional view of FIG. 3.

Here, if θ is made smaller than the aforementioned angle of 0.2 degrees, i.e., the length of the terrace 6 is made larger, the nucleation of crystal growth takes place in a two- or three-dimensional manner. Consequently, as shown in FIGS. 3 and 4 by way of example, each crystal 2 exhibits two or more crystal orientations within the m-plane 4 thereof. This means that a (11-22), (10-13) plane, and the like, other than an m-plane, grows on the terrace 6, thus preventing the realization of m-plane growth involving fewer defects.

If θ exceeds 10 degrees, the length of the terrace 6 becomes smaller, thus causing the substrate to become similar to a regular markedly-uneven substrate. Consequently, it is impossible to grow an excellent crystal.

It should be noted next that, there are further carried out an annealing step of alleviating damage due to the cutting step and a step of making a growth surface oxidized by the annealing step rich in aluminum, thereby preventing the growth surface from being nitrided, following the aforementioned cutting step.

Hereinafter, an explanation and experimental results will be made in detail of a specific method of experimentation carried out by the present inventor.

An m-plane sapphire substrate 1 having a moderate off-angle of 0.5 to 4 degrees in a [11$\bar{2}$0] direction is loaded into an MOCVD apparatus and heated to 700 to 1000° C. in a hydrogen atmosphere, thereby removing impurities on the surplane of the substrate. At this time, the chance of the surplane being exposed to ammonia is minimized. The reason for having selected the aforementioned [11$\bar{2}$0] direction of sapphire is that a step-flow (growth of a crystal along a step) from a step of sapphire in this orientation was thought to be desirable for GaN oriented in an m-plane (10-10) direction.

Then, the substrate is cooled down to 500° C., and an AlN nucleation layer having a film thickness of 20 to 100 nm is formed under the gas condition of a high V/III ratio. In addition, the substrate is heated to 1000 to 1100° C., thereby forming a GaN layer under the same conditions as those of regular c-plane GaN growth.

FIG. 5 shows the result of X-ray diffraction in a 2θ/ω scan mode of a GaN crystal grown on the sapphire substrate 1 using a method of the present invention. Considering that there were observed only three peaks derived respectively from m-plane sapphire and m-plane GaN, it has been confirmed that no crystal growth took place on any planes other than the m-plane. Thus, it has been confirmed that crystal growth took place only on the m-plane. In this way, it is possible to perform the m-plane growth of an excellent nitride crystal using a vapor phase method, even if the inexpensive sapphire substrate 1 is used as a substrate for crystal growth.

In addition, prior to forming the AlN layer and the GaN layer, there were used (i) a substrate prepared by performing no treatments on the sapphire substrate 1 in which a step 5 is formed by means of cutting, (ii) a substrate prepared only by annealing the sapphire substrate 1 at 1400° C., and (iii) a substrate prepared by annealing the sapphire substrate 1 at 1400° C. and then flowing a TMA (trimethyl aluminum), thereby placing the surplane of the substrate in the aforementioned rich in aluminum state, in order to grow AlN thereon, respectively. As a result, in the case of the substrate (i) on which no treatments were performed and the substrate (iii) which was placed in a rich in aluminum state, m-plane (10-10) GaN grew. In contrast, in the case of the substrate (ii) which was only annealed at 1400° C. and, therefore, the surplane of the sapphire substrate 1 was oxygen-rich, (11-22)-plane GaN rather than m-plane GaN grew.

This is because the uppermost surplane of the sapphire substrate 1 is not nitrided when the AlN layer is deposited thereon. That is, when depositing the AlN layer, the layer can be deposited in the form of AlN by preventing the initial deposition of N alone. Accordingly, it is possible to efficiently grow an m-plane oriented GaN single crystal by avoiding nitridation and making the uppermost surplane of the growth surface 3 aluminum rich after an annealing treatment.

Note here that although Japanese Patent Laid-Open No. 2005-343713 discloses enhancing crystal quality by using a stepwise substrate, a c-plane is grown in the substrate. Thus, the method disclosed is not intended to grow an m-plane whereby it is possible to increase the aforementioned overlap of wave functions between electrons and holes.

The sapphire substrate for crystal growth of the present invention is characterized by having an off-angle plane slanted from an m-plane by a predetermined very small angle, as a growth surface.

In addition, a method for manufacturing a nitride semiconductor luminescent element of the present invention, in which a sapphire substrate for crystal growth is used and the nitride semiconductor luminescent element is crystal-grown on the sapphire substrate, preferably includes a cutting step of preparing a-plane slanted from the m-plane by a predetermined very small angle, prior to a step of crystal growth, when using the m-plane of the sapphire substrate as a growth surface.

According to the above-described configuration, in a sapphire substrate for the growth of crystals, such as the GaN, used for a GaN light-emitting diode or the like, there is prepared by means of cutting or the like, a-plane slanted from the m-plane by a predetermined very small angle, preferably 0.2 to 10 degrees, more preferably 0.5 to 4 degrees, and particularly preferably only 2 degrees or so, in a [11$\bar{2}$0] direction, as a growth surface to serve as a template of the crystal. Consequently, the sapphire substrate forms into a stair-like stepwise substrate having steps and terraces on the growth surface.

Accordingly, an a-plane of GaN is allowed to grow from each step plane formed as an a-plane of sapphire onto a terrace in a vapor phase method, such as an MOCVD method, by controlling the steps of a substrate, even if an inexpensive sapphire substrate which normally does not form any m-plane (nonpolar plane) GaN film is used as the substrate for crystal growth. Thus, an epitaxially-grown excellent GaN single crystal continues to grow, so that the m-plane thereof is opposite to the surplane of the terrace. In the mean time, the respective steps become integrated (fused) with one another. Thus, a device can be obtained from an m-plane GaN single crystal substrate. In addition, the use of an m-plane eliminates the influence of piezo electric fields and makes it possible to increase the overlap of wave functions between electrons and holes. In this way, a substrate and a device which can enhance radiative recombination efficiency, i.e., internal quantum efficiency, can be realized.

Furthermore, in the sapphire substrate of the present invention, the growth surface is preferably rich in aluminum, between aluminum and oxygen which are constituent elements of sapphire.

Still furthermore, in the sapphire substrate of the present invention, the growth surface is preferably aluminum rich and not nitrided.

Still furthermore, the method for manufacturing a nitride semiconductor luminescent element of the present invention preferably further includes an annealing step to alleviate damage due to said cutting step, a step to make the growth surface aluminum rich following oxidation which occurs in the annealing step, and a step to avoid nitridation.

According to the above-described configuration, it is possible to efficiently grow a GaN single crystal in which the m-plane is grown, by making the growth surface, i.e., the uppermost surplane, rich in aluminum.

Still furthermore, the nitride semiconductor luminescent element of the present invention preferably uses the aforementioned sapphire substrate.

According to the above-described configuration, it is possible to realize a nitride semiconductor luminescent element which can enhance radiative recombination efficiency, i.e., internal quantum efficiency.

In the sapphire substrate 1, the plane to be used is not limited to a [11$\bar{2}$0] plane but may be a [0001] plane. This is because the step 5 shown in FIG. 1 forms a c-plane and GaN grows along the a-axis thereof in a direction perpendicular to a plane formed by the step 5, if the substrate is cut with an off-angle from the m-plane in a [0001] direction.

It should be noted that in the specification of the present application, any constituent elements described as means for achieving certain functions are not limited to those configurations described herein and intended to achieve these functions, but include the configurations of units, parts and the like for achieving these functions.

INDUSTRIAL APPLICABILITY

According to the present invention, it is possible to grow an m-plane GaN crystal and obtain a device having superior characteristics, even if an inexpensive sapphire substrate is used as a substrate for crystal growth.

The invention claimed is:

1. A sapphire substrate for crystal growth, comprising an off-angle plane slanted from an m-plane by a predetermined very small angle of slant, as a growth surface, wherein
    within the constituent elements of sapphire (aluminum and oxygen), said growth surface is rich in aluminum, and is not nitrided aluminum,
    said angle of slant is 0.5 to 4 degrees with respect to a [11$\bar{2}$0] direction, and
    the sapphire substrate forms a stair-shaped stepwise substrate having an a-plane step and an m-plane terrace substantially perpendicular to the a-plane step on the growth surface.

2. A nitride semiconductor luminescent element comprising a sapphire substrate according to claim 1.

* * * * *